(12) United States Patent
Kokuryo et al.

(10) Patent No.: US 7,039,123 B2
(45) Date of Patent: May 2, 2006

(54) SIGNAL DEMODULATION METHOD AND APPARATUS FOR REPRODUCING DATA FROM RECEIVED SIGNAL

(75) Inventors: Yoshiro Kokuryo, Tachikawa (JP); Kunihiko Kondo, Kodaira (JP); Hiroyuki Ando, Kodaira (JP); Nobuo Hirose, Hino (JP)

(73) Assignee: Hitachi Koksusai Electric, Inc., Tokyo (JP)

( * ) Notice: Subject to any disclaimer, the term of this patent is extended or adjusted under 35 U.S.C. 154(b) by 904 days.

(21) Appl. No.: 09/985,754

(22) Filed: Nov. 6, 2001

(65) Prior Publication Data

US 2002/0054649 A1 May 9, 2002

(30) Foreign Application Priority Data

Nov. 8, 2000 (JP) .............................. 2000-340717

(51) Int. Cl.
H04L 25/49 (2006.01)
(52) U.S. Cl. ...................... 375/295; 375/324; 375/344; 375/323; 370/410; 370/349; 708/323
(58) Field of Classification Search ................ 375/295, 375/324, 344, 232, 323; 708/323
See application file for complete search history.

(56) References Cited

U.S. PATENT DOCUMENTS

| 4,574,246 A | 3/1986 | Yoshida |
| 4,695,969 A * | 9/1987 | Sollenberger ................ 708/323 |
| 5,283,780 A | 2/1994 | Schuchman et al. |
| 5,309,481 A * | 5/1994 | Viviano et al. ............. 375/344 |
| 6,121,828 A | 9/2000 | Sasaki |
| 6,389,070 B1 * | 5/2002 | Cugnini et al. ............. 375/232 |
| 6,522,702 B1 * | 2/2003 | Maruyama .................. 375/324 |

FOREIGN PATENT DOCUMENTS

| EP | 0486474 A2 | 5/1992 |
| JP | 07170306 | 7/1995 |

* cited by examiner

Primary Examiner—Stephen Chin
Assistant Examiner—Eva Zheng
(74) Attorney, Agent, or Firm—Mattingly, Stanger, Malur & Brundidge, P.C.

(57) ABSTRACT

A demodulation method, and apparatus, for reproducing data from a received signal. The demodulation method includes the steps of: receiving a signal including a series of frames each containing a training signal for automatic equalization processing and a data signal; controlling an amplitude of the received signal by AGC processing so as to make the amplitude a predetermined level; conducting demodulation processing on the signal subjected to the AGC processing; periodically conducting automatic equalization processing so as to adapt the modulated signal to characteristics of the signal transmission path based on each training signal of the frame; and setting values of a time constant of the AGC processing and an update repetition period of the automatic equalization processing so as to satisfy a predetermined relation.

17 Claims, 10 Drawing Sheets

SIGNAL DEMODULATION METHOD AND APPARATUS FOR REPRODUCING DATA FROM RECEIVED SIGNAL

CROSS-REFERENCE TO RELATED APPLICATION

The present application relates to subject matters described in co-pending application Ser. No. 09/819,709 filed on Mar. 29, 2001 by Yoshihiro Kokuryo, et. al. and entitled "AUTOMATIC EQUALIZATION CIRCUIT AND RECEIVER CIRCUIT USING THE SAME." The disclosures of this application is incorporated herein by reference.

BACKGROUND OF THE INVENTION

The present invention relates to a demodulation method, and demodulation apparatus for reproducing data that can reduce reproduced data errors caused by a received signal level variation that is incurred by switchover of an antenna of a transmission side or other causes in transmission of radio data using a radio wave from a mobile body such as in a helicopter or a vehicle, or a stationary body to a mobile body or a stationary body.

In the case where data is radio-transmitted from a transmission apparatus (hereafter referred to as transmission side) mounted on a mobile body such as a helicopter or fixed on the ground to a reception apparatus (hereafter referred to as reception side) installed on a stationary on the ground or mounted on a mobile, a transmission antenna is attached to the transmission side. According to the relative position relation between the transmission antenna of a mobile body such as a helicopter and a reception antenna of the reception side, which receives a radio wave sent from the transmission antenna, and the travel direction of the mobile, a part of the mobile body obstructs the transmitted radio wave in some cases. Typically, therefore, a plurality of transmission antennas are attached to the left and right sides or front and rear portions of the mobile body of the transmission side. On the basis of the angle formed by the transmission antenna of the mobile body and the reception antenna, a transmission antenna having visibility with respect to the reception antenna is selected from among a plurality of transmission antennas and switchover thereto is conducted. A radio wave for data signal transmission is sent from the selected transmission antenna.

As a concrete example of the foregoing radio transmission system, such an example that the transmission side is a traveling helicopter and the reception side is installed and fixed on the ground will now be described by referring to FIG. 7.

Numeral 108 denotes a reception antenna C connected to the reception side installed on the ground. Numeral 109 denotes a helicopter. Numerals 106 and 107 denote two transmission antennas A and B attached to the main body of the helicopter 109. Characters La and Lb denote a radio propagation distance between the transmission antenna A 106 and the reception antenna C 108 and a radio propagation distance between the transmission antenna B 107 and the reception antenna C 108, respectively. Radio wave emission from the helicopter 109 is conducted from either the transmission antenna A 106 or the transmission antenna B 107 on the basis of the relative position relation between the transmission antennas and the reception antenna as described later.

As for the selection rule of the transmission antenna, the antenna B 107 is used while the reception antenna C 108 is located on the left side (bottom side in FIG. 7) with respect to the flight direction D of the helicopter 109. The antenna A 106 is used while the reception antenna C 108 is located on the right side (top side in FIG. 7), the antenna A 106 is used.

Therefore, means for conducting antenna switchover described later is provided on the transmission side. An angle formed by the direction of the reception antenna C 108 viewed from the helicopter 109 with respect to a flight direction D is denoted by $\theta$. When a predetermined change has occurred in the angle $\theta$, switching between the transmission antennas A and B (106 and 107) is conducted accordingly. The sign (polarity) of the angle $\theta$ in the direction indicated by the arrow (counter clockwise) shown in FIG. 7 is positive (+), and negative (−) in the opposite direction (clockwise). When the sign of the angle $\theta$ changes from positive to negative, or changes from negative to positive due to a change of the flight direction D of the helicopter 109 and the absolute value of the angle $\theta$ at that time has become at least a predetermined value $\phi$ in the range of, for example, one to three degrees, the transmission antenna is switched over.

It is now assumed that at first a radio wave is emitted from the transmission antenna B 107 and received by the reception antenna C 108 and data transmission is conducted. And it is assumed that the sign of the angle $\theta$ formed by the flight direction D of the helicopter 109 and the reception antenna C 108 changes due to a change of the flight direction D of the helicopter 109 as shown in FIG. 7 and the absolute value has become equal or more than the predetermined angle $\phi$. Thereupon, data transmission conducted heretofore by a radio wave emitted from the transmission antenna B 107 is switched over to a radio wave emitted from the transmission antenna A 106 having clearer sight with respect to the reception antenna C 108.

Even if the sign of the angle $\theta$ formed by the flight direction of the helicopter 109 and the reception antenna C 108 does not change while its absolute value becomes large, thereafter emission of the radio wave from the transmission antenna A 106 is continued.

If switching between the two transmission antennas A and B (106 and 107) is conducted, however, the following problem occurs. In the case where transmission is conducted by using a radio wave having a carrier frequency of, for example, 7 GHz, one wavelength is approximately 4.3 cm (=the velocity of light $3.0 \times 10^{10}$ (cm/second)×1/7 GHz). It is now assumed that the distance between two transmission antennas A and B (106 and 107) attached to the helicopter 109 is 400 cm. In the case where the angle $\theta$ is 1 degree, the distance difference (=La−Lb) between the distances from two transmission antennas A and B (106 and 107) to the reception antenna C 108 on the ground is approximately 7 cm. The shift of the carrier phase of the radio wave becomes 360 degrees×7 cm÷4.3 cm=586 degrees, i.e. 226 (=586−360) degrees. If antenna switching is conducted at the angle $\theta$=1 degree, then the phase of the carrier of the radio wave the signal on which is received on the ground thus changes by 226 degrees.

In this way, the carrier phase of the received radio wave suddenly changes greatly due to the transmission antenna switching. Or as a matter of fact, there is a signal level difference depending upon the circuit ranging from the antenna switchover switch to radio wave sending via the transmission antenna A 106 or the transmission antenna B 107, the transmission antenna, the cable length, and so on. Accordingly, a transmitted signal level difference between the transmission antennas A and B (106 and 107) is caused by the transmission antenna switchover. This results in a problem that data errors occur on the reception side.

In the case of a multi-level amplitude modulation scheme, the decistion margin for the amplitude becomes very small especially as the number of multiple levels increases. For example, a signal constellation of the 64 QAM (Quadrature Amplitude Modulation) is shown in FIG. 9. In a decision unit of the demodulation apparatus, a decision boundary as represented by a dotted line is provided with respect to a signal position of a received signal (black dot in FIG. 9). Even if there are influence of noise, an equalization error, and a received signal level variation, a signal point received from the transmission side can be estimated and decision correctly and received data can be reproduced unless the received signal exceeds the decision boundary.

As an example, a signal constellation in the case where the received signal level has suddenly dropped by approximately 1 dB is shown in FIG. 10. When the amplitude of the signal position of the received signal (black dots in FIG. 10) becomes small, the signal position approaches the origin, and gets out of the reference point located in the center of the decision boundary area (area surrounded by dotted lines). Therefore, the margin from the decision boundary is decreased. In this situation, if there is noise on the transmission path, an equalization error, a received signal level variation, and so on, then the received signal exceeds the decision boundary, and even when the noise is added to the signal or the transmission data cannot be reproduced correctly, resulting in errors of received data. In addition, in the case where a sudden change of the received signal level generated at the time of transmission antenna switchover is great, by only such change of signal level the decision boundary and errors are caused in received data.

SUMMARY OF THE INVENTION

An object of the present invention is to suppress occurrence of data errors on the reception side and continuously reproduce highly reliable received data, even if there is a difference between received signals from transmission antennas, which is caused by switching transmission antennas or by other reasons.

In order to solve the problem caused by transmission antenna switchover, the transmission side outputs a frame pulse synchronized to a frame that includes a training signal and a data signal, conducts the transmission antenna switchover in synchronism with the frame pulse, and transmits a radio wave. According to the present invention, the reception side is provided with an improved demodulation method and apparatus using a improved automatic equalization processing which can surely suppress data errors of received signal due to switchover of the transmission antenna and other reasons.

First, a method of switching over the antenna on the transmission side will now be described.

In this method, the transmission side outputs a frame pulse Fp synchronized to a frame that includes a training signal and a data signal, and conducts the transmission antenna switchover in synchronism with the frame pulse Fp. Thereupon, it becomes possible to generate a variation of the carrier phase or the received signal level in the training signal located at the head of the frame. And as described later, data reproduction is performed by conducting equalization and correction in automatic equalization processing using the received training signal and a training signal generated on the reception side.

FIGS. 5 and 6 are a signal diagram and a block diagram of the transmission side showing the switching method. A frame pulse Fp is output from a modulation section 101 via a frame pulse terminal 71 during a training signal interval DT0 as shown in (f) of FIG. 5, and supplied to an antenna switchover circuit 113.

A data signal shown in (a) of FIG. 5 is input from a data signal terminal 51 of the transmission side shown in FIG. 6. The data signal is temporarily stored in a FIFO (First In/First Out) memory (not shown) of a modulation section 101 as shown in (b) of FIG. 5. The data signals (DA0, DA1, . . . ) divided in predetermined lengths are added with the training signals (DT0, DT1, . . . ) of (c) of FIG. 5 at each of the head of the data signals so as to produce a transmission signal having a frame configuration as shown in (d) of FIG. 5. A transmission signal shown in (d) of FIG. 5 is modulated in the modulation section 101 and output from a modulation signal terminal 70 as a modulated signal shown in (e) of FIG. 5. The modulated signal is up-converted to an RF signal in a high frequency section 102, and the RF signal is supplied to either a path of an amplifier 103 and a transmission antenna A 106 or a path of an amplifier 105 and a transmission antenna B 107 via an antenna switchover switch 104. The RF signal is power-amplified and sent out from the transmission antenna as a radio wave.

Transmission antenna switchover using the antenna switchover switch 104 is conducted as follows. It is now assumed that radio wave emission for data transmission is being conducted from the transmission antenna B107. When the sign (polarity) of the angle θ shown in FIG. 7 changes and the absolute value has become at least the predetermined value φ as described earlier, a switchover signal Ac shown in (h) of FIG. 5 is supplied from antenna switchover command generation unit (not illustrated) to the antenna switchover circuit 113 via a switchover command signal terminal 114. A frame pulse Fp shown in (f) of FIG. 5 is also supplied to the antenna switchover circuit 113. In the antenna switchover circuit 113, an antenna switchover signal As shown in (g) of FIG. 5 is generated at time t0 in synchronism with the frame pulse Fp. Antenna switchover is conducted only at head timing of the frame. Emission of a radio wave for data transmission is conducted from the transmission antenna A 106 via the amplifier 103.

When either of the two transmission antennas is selected according to the condition of the angle θ as described above and a radio wave for data transmission is sent out from the selected antenna, then the reception side receives the radio wave sent from the antenna as a result of the antenna switchover effected in synchronism with a frame timing, and conducts data reproduction while suppressing data errors by using automatic equalization processing. This method will now be described by referring to FIG. 2, which is a block diagram of a demodulation section, FIG. 8, which is a configuration block diagram of the reception side, and FIG. 11, which is a timing diagram of automatic equalization processing conducted in a demodulation section 111. FIG. 2 is a block diagram of a demodulation section of a first embodiment of the present invention described later.

In the configuration of the transmission side shown in FIG. 6, the transmission signal of (d) of FIG. 5 is modulated, and the modulated signal shown in (e) of FIG. 5 is converted to an RF signal. The RF signal is sent out from either of the transmission antennas A and B (106 and 107) as a radio wave in accordance with timing shown in FIG. 5. The radio wave is received by a reception antenna C 108 of the reception side shown in FIG. 8.

The received radio wave is down-converted to an intermediate frequency signal in a reception radio frequency section 110, and the down-converted signal is output from a received modulated signal terminal 115 as a received modulated signal of intermediate frequency, and supplied to a demodulation section 111 of a subsequent stage. The received modulated signal is subjected to AGC (Auromatic Gain Control) processing, demodulation processing, automatic equalization processing, and signal identifying processing in the demodulation section 111, and output from a received data terminal 112 as reproduced data.

Hereafter, operation of the demodulation section 111, in which automatic equalization processing is conducted, will be described.

For this automatic equalization processing, an automatic equalizer for equalizing the demodulated signal and an automatic equalization processing section for equalization training are provided. When a training signal is received, the training signal is temporarily stored in a memory successively and read out successively at predetermined timing. On the basis of a reference training signal generated on the reception side, update processing of tap coefficients of digital filters for setting the equalization characteristics of the transmission path is conducted by using the automatic equalization processing section for equalization training. By successively setting an updated result for the tap coefficients in the automatic equalizer for equalizing the demodulated signal, the tap coefficients for setting the equalization characteristics of the transmission path required for the reproduction of the data signal are updated.

The automatic equalizer has a function of automatically equalizing a received signal so as to eliminate influence of waveform distortion, echo, signal level change, or the like, which may be given to a transmission signal on a transmission path. It is therefore necessary to set predetermined equalization characteristics on the automatic equalizer beforehand.

Here, the automatic equalizer is generally designed to carry out an operation with a complex number comprised of an in-phase component and a quadrature component. An example of such an automatic equalizer will be described with reference to FIG. 12.

The equalizer 9 shown in FIG. 12 is constituted by two adders 18A and 18B and four transversal filters 19A to 19D. The inputs and outputs of the equalizer 9 has a relation as follows.

Now, assume that respective tap coefficients of the respective transversal filters 19A to 19D are Ci and Cq as shown in FIG. 12. Furthermore, assume that values of the input signals Ir and Qr are expressed by Ir and Qr. Then, the relation among the value (Ir+j·Qr) of the input signal expressed by a complex signal number and the tap coefficients Ci and Cq can be expressed by:

$$(Ir+j \cdot Qr) \cdot (Ci+j \cdot Cq) = (Ir \cdot Ci - Qr \cdot Cq) + j \cdot (Ir \cdot Cq + Qr \cdot Ci)$$

Accordingly, values of the output signals Ia and Qa can be expressed by the input signals Ir and Qr and the tap coefficients Ci and Cq as follows.

$$Ia = Ir \cdot Ci - Qr \cdot Cq$$

$$Qa = Ir \cdot Cq + Qr \cdot Ci$$

Thus, the characteristics of the output signals Ia and Qa with respect to the input signals Ir and Qr, that is, the transmission characteristics can be changed by changing the tap coefficients Ci and Cq.

Here, each of the transversal filters 19A to 19D of the automatic equalizer 9 is generally constituted by (N−1) delay elements 191, N multipliers 192 and an adder 193 as shown in FIG. 13. N is an integer number more than 1. The transmission characteristics of each of the transversal filters 19A to 19D are established by coefficients C1 to CN set in the multipliers 192, respectively. These coefficients are called tap coefficients. The equalization characteristics of the automatic equalizer 9 are set by updating the tap coefficients. Further details about the automatic equalizer are described in the specification of the co-pending patent application Ser. No. 09/819,709.

In the demodulation section 111, a portion having a function of conducting update processing of the tap coefficients for equalizing the received signal to be adapted to the characteristics of the transmission path and setting the updated tap coefficients in the automatic equalizer 9 for data reproduction is referred to as automatic equalization processing section for equalization training 202. The automatic equalization processing section for equalization training 202 includes an automatic equalizer for equalization training 23, a tap coefficient update unit 13, a training signal generation circuit 14, and adders 16A and 16B. A portion of the demodulation section 111 for implementing the AGC function is referred to as AGC processing section 201. The AGC processing section 201 includes an AGC 2, an A/D converter 3, a received power calculator 4, and a gain setting unit 2A.

In FIG. 11, a training signal DT and a data signal DA of a received signal (Ir, Qr) shown in (a) of FIG. 11 are provided with numbers 0, 1, 2, . . . . So as to correspond thereto, a training signal DT and a data signal DA shown in (f) of FIG. 11 are also provided with numbers 0, 1, 2, . . . . In (a) and (f) of FIG. 11, signals having the same number correspond to each other.

In (a) of FIG. 11, a frame comprised of a training signal DT1 in a period X having a time length tt and a data signal DA1 in a following period Y having a time length td is transmitted continuously from a transmission side, and received on the reception side.

In the demodulation section 111 of FIG. 2, a received modulated signal having a carrier frequency f is first input to an analog BPF 1 and band-limited therein. The output of BPF 1 is made constant in level irrespective of the received signal level, by the AGC section 2. The output of AGC 2 is input to the A/D converter (analog-digital converter) 3 to be converted to a digital signal. The output of A/D converter 3 is supplied to the received power calculator 4 and multipliers 5A and 5B.

The AGC 2 is a variable gain amplifier. In the received power calculator 4, power of the received signal is calculated on the basis of the digital signal output from the A/D converter 3. The gain of the AGC 2 is set by the gain setting unit 2A.

The digital signal supplied to the multipliers 5A and 5B is multiplied therein by a carrier signal having a frequency f supplied from a sine wave generator 7. Signals of an in-phase component (I component) Im and a quadrature component (Q component) Qm are taken out.

At this time, the multiplier 5A is supplied with the carrier signal directly from the sine wave generator 7. The multiplier 5B is supplied with the carrier signal shifted in phase by π/2 in a phase shifter 6. Thus, orthogonal demodulation is conducted.

Here, a sine wave signal input to the multiplier 5A is represented as $\cos(\omega t)$, and a sine wave signal input to the multiplier 5B is represented as $\sin(\omega t)$, where $\omega = 2\pi f$.

Signals Im and Qm respectively of the in-phase component (I component) and the quadrature component (Q component) respectively output from the multipliers 5A and 5B are subject to waveform shaping respectively in roll-off filters 8A and 8B, and then taken out as received signals Ir and Qr of (a) of FIG. 11, respectively.

The received signals Ir and Qr are respectively supplied to delay circuits 27A and 27B, provided with predetermined delay time T therein, and input to the automatic equalizer for data reproduction 9 respectively as a received signal (IrD, QrD) shown in (f) of FIG. 11. The predetermined delay time τ is set to time required for transmission of data of one frame, i.e., the sum of time (transmission time tt) required for transmitting the training signal DT once and time (transmission time td) required for transmitting the data signal DA. In other words, τ=tt+td.

A data signal (Ia, Qa) equalized by the automatic equalizer for data reproduction 9 is input to an decision unit 10. In the decision unit 10, a signal point of the data sent from the transmission side is identified. A result of this decision or identification is output as a data signal (Id, Qd). The data signal (Id, Qd) is converted to a serial signal by a P/S converter 11. Reproduced received data is thus obtained.

Heretofore, operation of the configuration from the analog BPF 1 to the P/S converter 11 through the delay circuits 27A and 27B and the automatic equalizer for data reproduction 9 has been described.

Furthermore, as described above, the received signal (Ir, Qr) comprised of the I component and the Q component, which is the received signal shown in (a) of FIG. 11, is subject to a delay of one frame, and supplied to the automatic equalizer for data reproduction 9 as a received signal (IrD, QrD) shown in (f) of FIG. 11. At the same time, the signal (Ir, Qr) for the training signal DT1 in the period X is temporarily stored in memories 21 and 22 successively as shown in (b) of FIG. 11, by making switch circuits 20A and 20B in closed state with a signal S1, which is generated by a training signal synchronization detector 12 in the period X.

Subsequently, as shown in (b1) of FIG. 11, signals Ir' and Qr' of the training signal DT1 stored in the memories are read out at predetermined timing, and supplied to the automatic equalization processing section 202 for equalization training. The signals Ir' and Qr' become an equalization signal (Ia', Qa') subjected to equalization processing in the automatic equalizer 23 for equalization training. A difference between the equalization signal (Ia', Qa') and a reference training signal (It, Qt), which serves as a reference signal of tap coefficient update processing and which is generated in the training signal generation circuit 14, is derived by the adders 16A and 16B. By using an equalization error signal E (Ei, Eq) thus derived, tap coefficient update processing for the equalization characteristics of the transmission path is conducted in the tap coefficient update unit 13. Details of the tap coefficient update algorithm are disclosed in, for example, the documents described below, and consequently they will be omitted.

The algorithm for setting the equalization characteristics is known well in the art. For example, the details thereof are disclosed in "DIGITAL SIGNAL PROCESSING", by Hiroshi MIYAKAWA et al., edited by The Institute of Electronics and Communication Engineers of Japan, November 1975, pages 231–243, and in, "ADAPTIVE EQUALIZATION", by Shahid U. H. Qureshi, Proceedings of The IEEE, vol. 73, No. 9, September 1985, pp. 1349–1387.

As shown in (c) of FIG. 11, the update processing of these tap coefficients is conducted on the training signal DT1 in a period ts, and updated tap coefficients Ct1 are obtained. In a subsequent period X, a received signal (Ir, Qr) of a received training signal DT2 is stored in the memories 21 and 22 to provide for update processing of the tap coefficients for equalizing the next data signal DA2.

Immediately before the start of a period Y of a data signal DA2, a switch circuit 25 is closed by a signal S2, which is generated by the training signal synchronization detector 12. As a result, the tap coefficients Ct1 updated in the tap coefficient update processing are set in the automatic equalizer for data reproduction 9. The signals IrD and QrD of the data signal DA1 shown in (f) of FIG. 11 are equalized by the automatic equalizer for data reproduction 9 on the basis of the tap coefficients Ct1, and then a signal point of the received data is identified. Thereafter, the signals IrD and QrD of the data signal DA1 are reproduced in the P/S converter 11 as serial data of the data signal DA1 transmitted from the transmission side, and output from a received data terminal 112. This is conducted in the period Y of the data signal. For this period, switch circuits 24A and 24B are closed by a signal S1, which is generated by the training signal synchronization detector 12, and the serial data of the data signal DA1 is supplied to the decision unit 10 of the subsequent stage.

Thereafter, in the same way, on the basis of periodically inserted training signals DT2, DT3, . . . of the received signal (Ir, Qr), and the reference training signal (It, Qt), which serves as a reference signal of tap coefficient update processing and which is generated in the training signal generation circuit 14, tap coefficients Ct2, Ct3, . . . are obtained in the tap coefficient update processing by the automatic equalization processing section 202 for equalization training. The tap coefficients Ct2, Ct3, . . . thus obtained are set in the automatic equalizer 9 for data reproduction at predetermined timing. Thus, data signals DA2, DA3, . . . are equalized, and received data with data errors suppressed are reproduced.

As a matter of fact, however, there is caused a signal level difference on the transmission side by variations of circuits, transmission antennas, and cable lengths in the range from the antenna switchover switch 104 to the transmission antenna A 106 or the transmission antenna B 107 for sending the radio wave, as described above. Besides the transmission signal level difference caused between the transmission antennas A and B (106 and 107) by the transmission antenna switchover, there is a cause that incurs data errors. It is caused by an influence of noise caused on the transmission path and an equalization error of automatic equalization processing of the characteristics of the transmission path conducted in the demodulation section 111, in addition to the transmission signal level difference at the time of transmission antenna switchover. The transmission signal level difference is often great. Under such a condition of received signals, the decision margin in the decision unit 10 in the demodulation section 111 becomes small, and data errors are caused as described earlier with reference to FIGS. 9 and 10.

The present invention provides such an improved signal demodulation method, and apparatus, that data errors of the received signal are reduced even if a large received level variation is caused by the antenna switchover on the transmission side or another cause.

A demodulation method, and apparatus, for reproducing data from a received signal according to the present invention includes the steps of: receiving a signal including a series of frames each containing a training signal for automatic equalization processing and a data signal; controlling an amplitude of the received signal by AGC processing to be a predetermined level; demodulating said received signal processed by the AGC processing;

periodically conducting automatic equalization processing to the demodulated signal so as to adapt said demodulated signal to characteristics of said signal transmission path based on each training signal of said frams; and setting values of a time constant of the AGC processing and an updating repetition period of the automatic equalization processing so as to have a predetermined relation.

As the signal demodulation method, and apparatus, of the present invention, broadly two embodiments are proposed as hereafter described.

In a first embodiment, the time constant of the AGC 2, which makes the received signal level constant as one function of the demodulation section 111, is made longer than an originally designed value. For example, the time constant of the AGC 2 is made longer than the repetition period of update setting of the tap coefficients in the automatic equalization processing. To be concrete, the time constant of the AGC 2 may be made longer than several frame length. Or it can be mentioned to adopt such a time constant as to suppress the received signal level variation input to the automatic equalization processing caused by time elapse between the start time point and end time point of a frame to a negligible small value, such as, for example, 0.5 dB or less. By doing so, the variation of the received signal level in the decision unit 10 between the start time point and the end time point of the pertinent received frame is reduced. That is, the training signal and the data signal of the pertinent received frame that is small in received signal level between at the start time point and end time point of the pertinent received frame although subjected to a large received signal level difference generated at the time of switchover of the transmission antenna become subject signals of the automatic equalization processing. On the basis of the training signal of such a received frame, tap coefficients equalized to the characteristics of the transmission path are determined in the automatic equalization processing section 202. And under such a signal condition that the variation of the received signal level is small until the end time point of the pertinent received frame, automatic equalization processing is conducted on the received frame signal in the automatic equalizer 9 having the tap coefficients set therein.

In this way, the received signal level difference generated at the time of transmission antenna switchover is suppressed by joint operation of the automatic equalization processing section for equalization training 202 and the automatic equalizer for data reproduction 9 that conduct automatic equalization processing on the AGC 2 and characteristics of the transmission path. The level variation of the output signal of the automatic equalization processing of the received signal is also suppressed to a small value. It thus becomes to ensure the identification margin. Errors of reproduced data caused at the time of switchover of the transmission antenna are thus suppressed to the utmost.

In the second embodiment, the set gain for the AGC 2 is not changed but made constant for a frame period of the received signal, according to the received power calculated every received frame. By utilizing the fact that transmission data has a frame structure comprised of a training signal and a data signal, received power over one frame is calculated. In addition, the gain setting of the AGC is conducted according to the calculated received power, only at the head reception time point of a training signal located at the head of a frame. At any time other than that, the gain setting of the AGC is not conducted. The received frame signal subjected to AGC processing with the set gain is subjected to automatic equalization processing in the automatic equalizer for data reproduction 9, on the basis of tap coefficients obtained by conducting update processing of tap coefficients for equalization to the characteristics of the transmission path in the automatic equalization processing section for equalization training 202.

By doing so, a constant AGC gain is set and AGC processing is conducted even if there is a large received signal level difference generated at the time of switchover of the transmission antenna. And with the tap coefficients updated on the basis of the training signal of the pertinent received frame, automatic equalization processing of the received frame signal is carried out in an optimum manner. Therefore, the output signal of the automatic equalization processing is not affected by the received signal level difference caused at the time of switchover of the transmission antenna at all. It thus becomes possible to ensure the decision margin. As a result, it becomes possible to suppress errors of the reproduced data to the utmost.

DESCRIPTION OF THE EMBODIMENTS

First, a method of considerably lengthening the time constant of the AGC, which is an embodiment of the present invention, will now be described by referring to FIGS. 1 and 2. The AGC (Automatic Gain Controller) is denoted by 2 in FIG. 2. It is now assumed that the time constant of the AGC 2 is set to a value longer than the originally designed time constant. It is assumed that the time constant is longer than the time length of several frames, or the time constant is longer than the repetition period of the tap coefficient update setting of the automatic equalization processing section 202.

Figure 5:
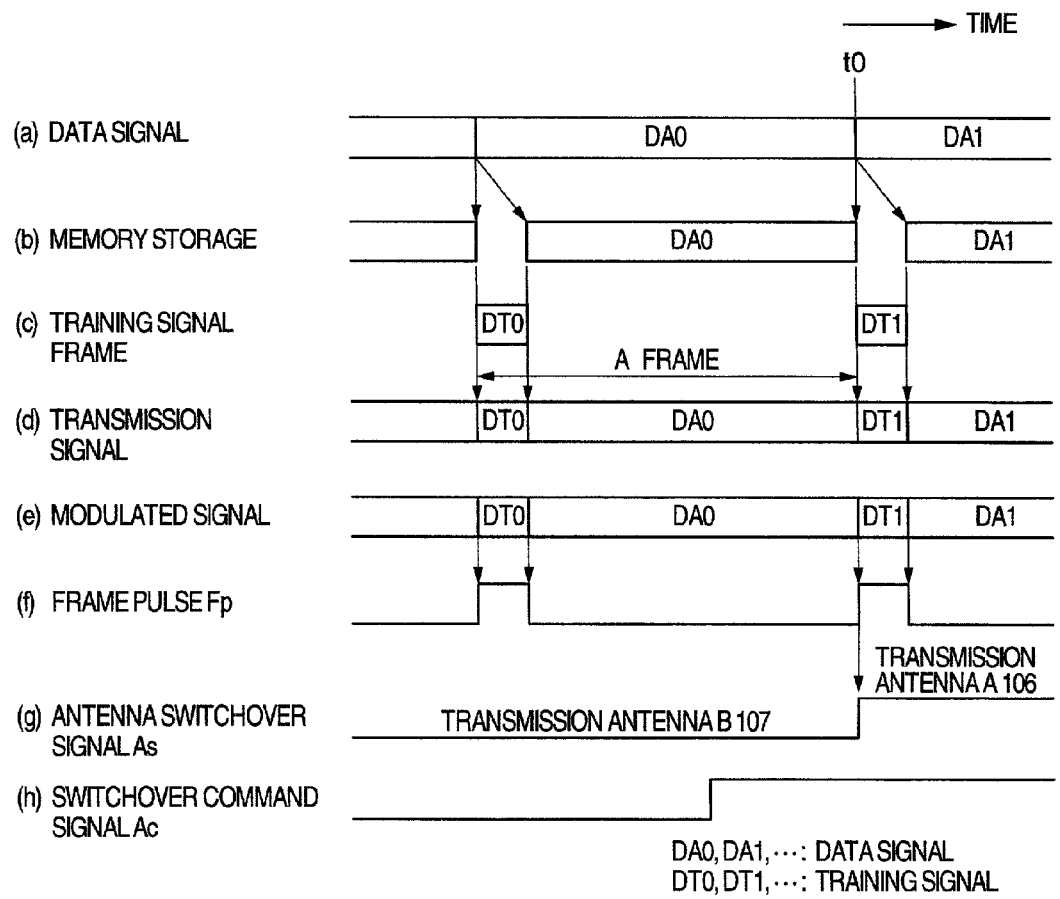
FIG. 5 is a signal timing chart showing operation of a configuration for conducting transmission antenna switchover on the transmission side.
Figure 6:
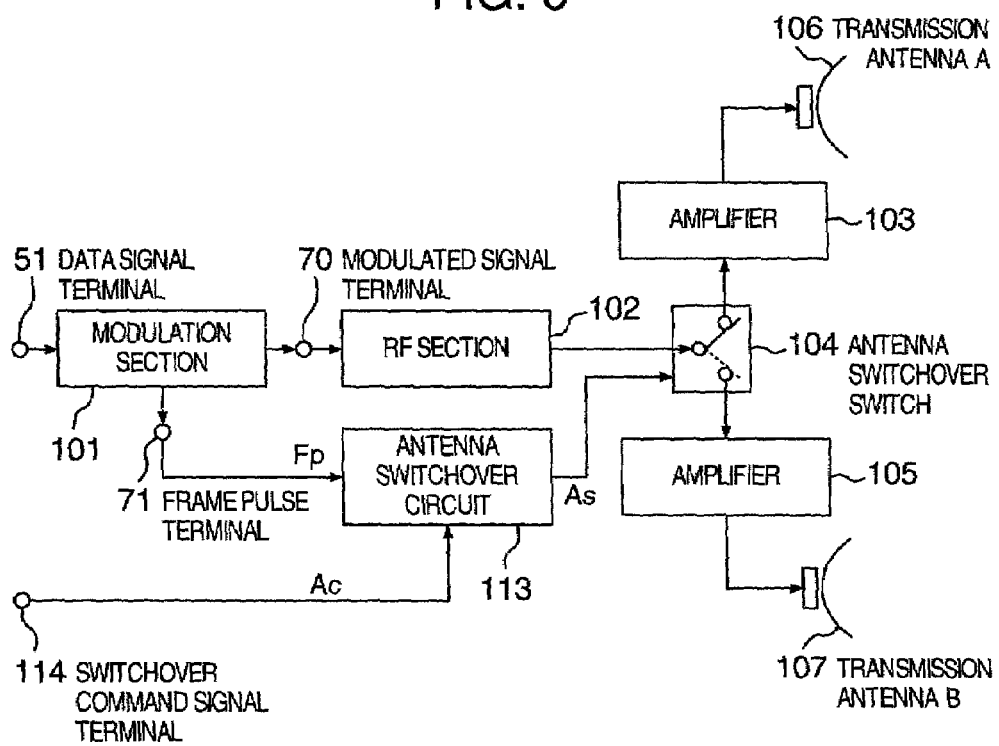
FIG. 6 is a block diagram showing a configuration for conducting transmission antenna switchover on a transmission side.
Figure 7:
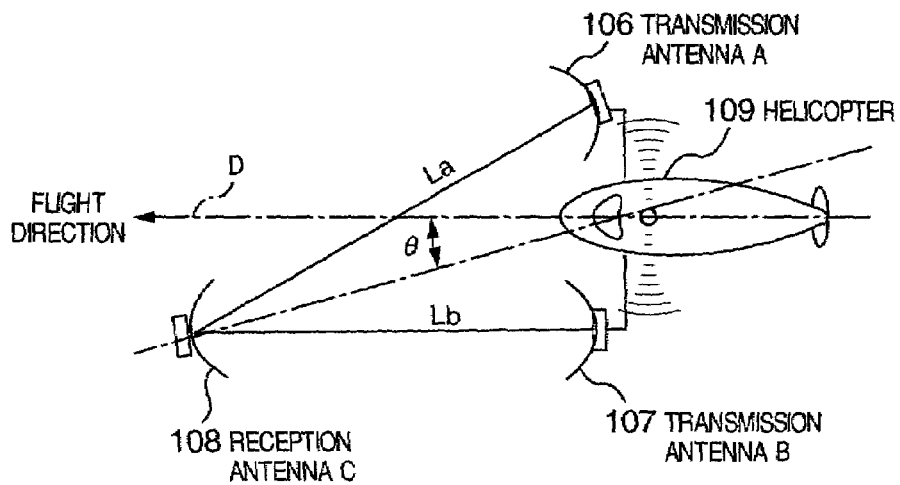
FIG. 7 is a diagram showing a relative positional relation between two transmission antennas mounted on a helicopter and a reception antenna installed on the ground.
Figure 8:
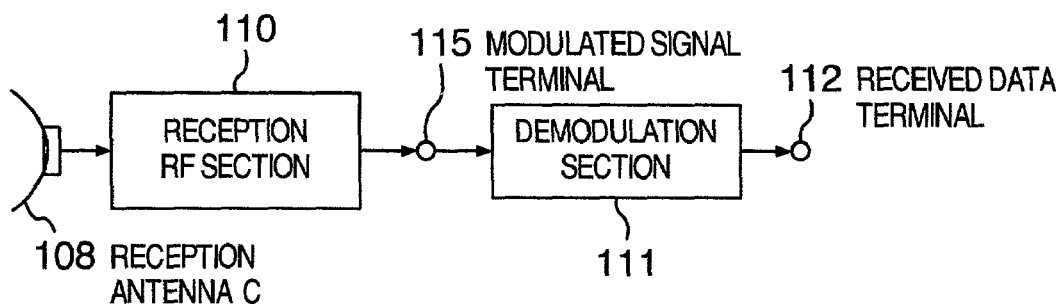
FIG. 8 is a block diagram showing a configuration example of a reception side.
Figure 9:
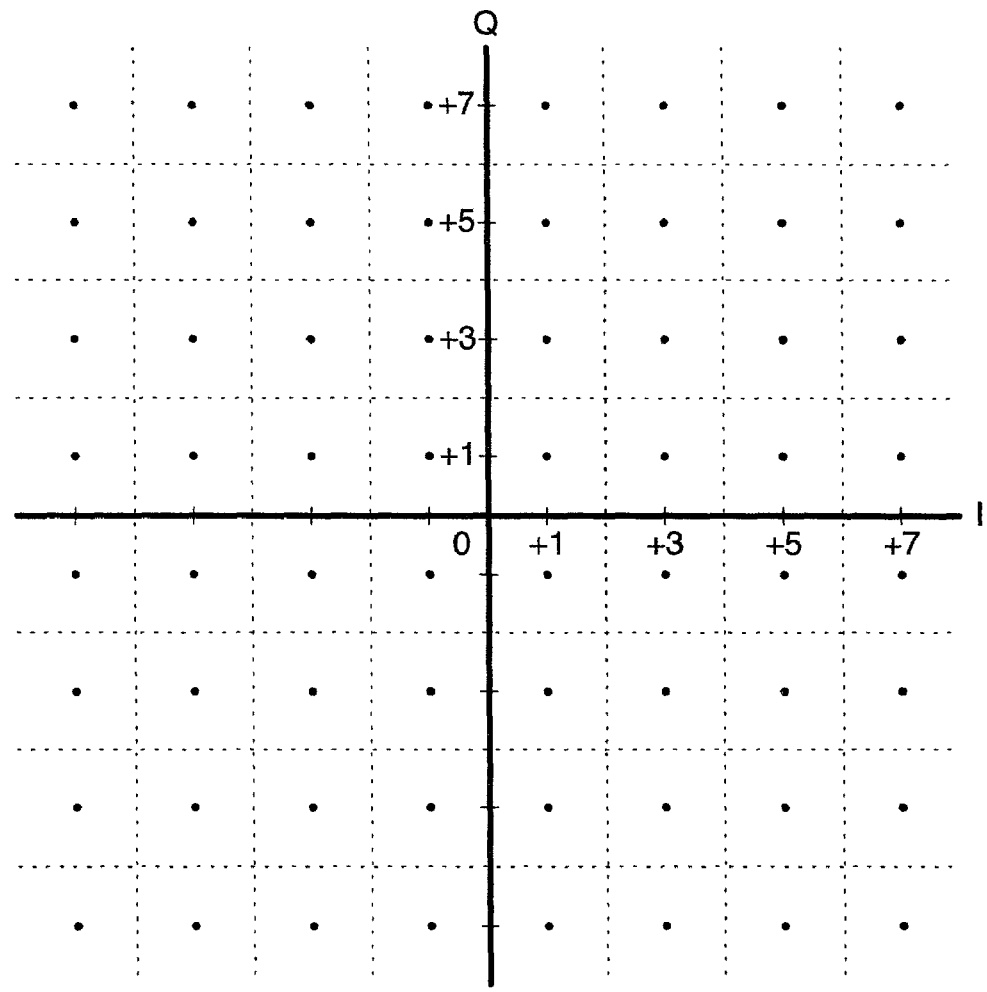
FIG. 9 is a signal constellation diagram of a multi-level amplitude modulation scheme (64 QAM)
Figure 10:
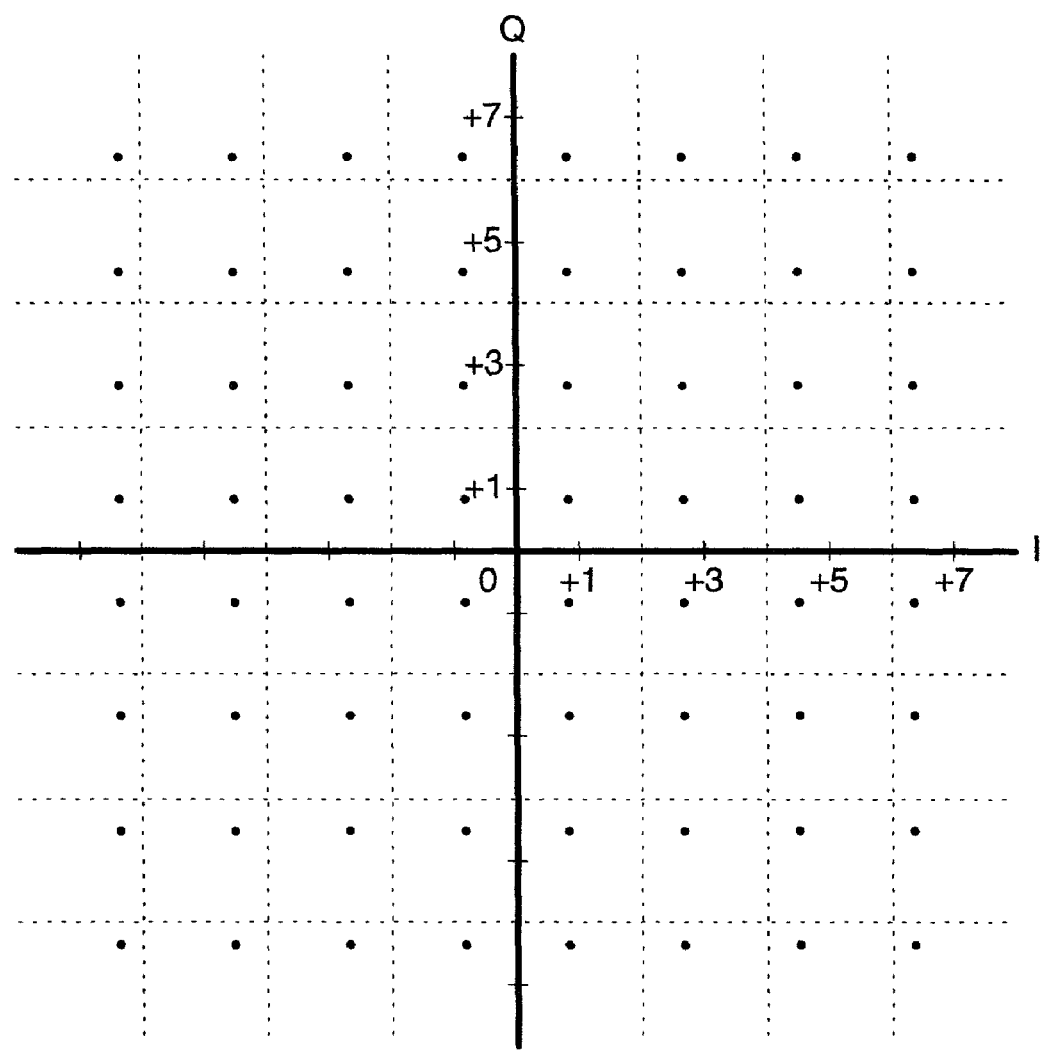
FIG. 10 is a signal constellation diagram of a multi-valued amplitude modulation scheme (64 QAM)
Figure 11:
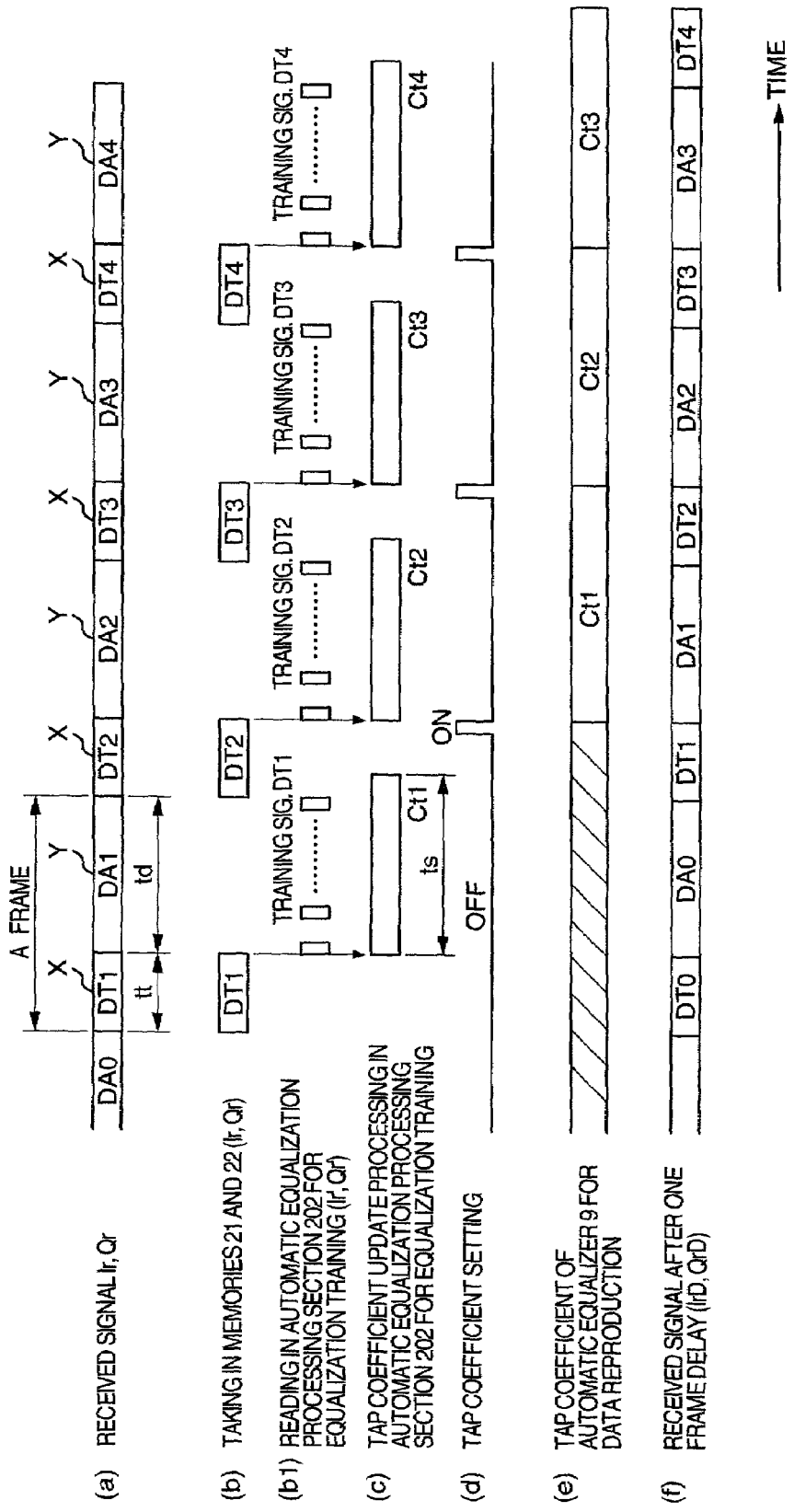
FIG. 11 is a signal timing chart of automatic equalization processing.
Figure 12:
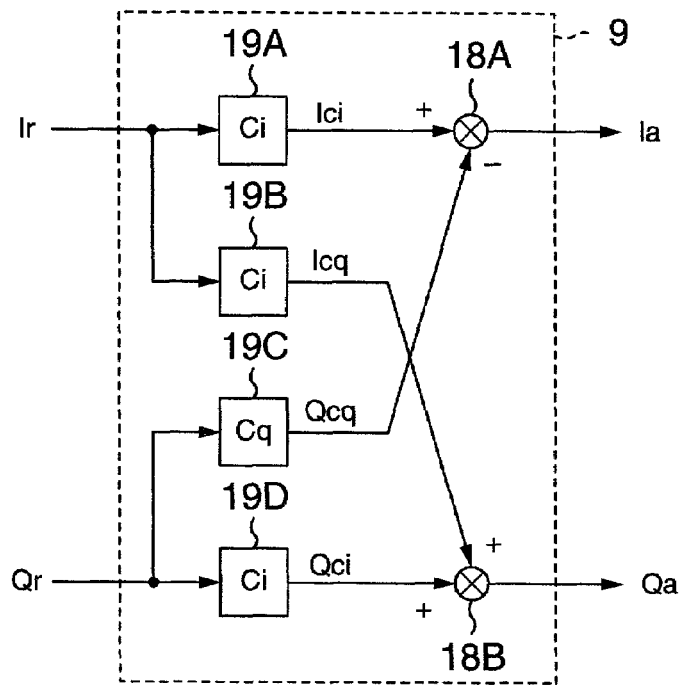
FIG. 12 is a block diagram showing an example of an automatic equalizer in a demodulation circuit of a digital multi-level signal.
Figure 13:
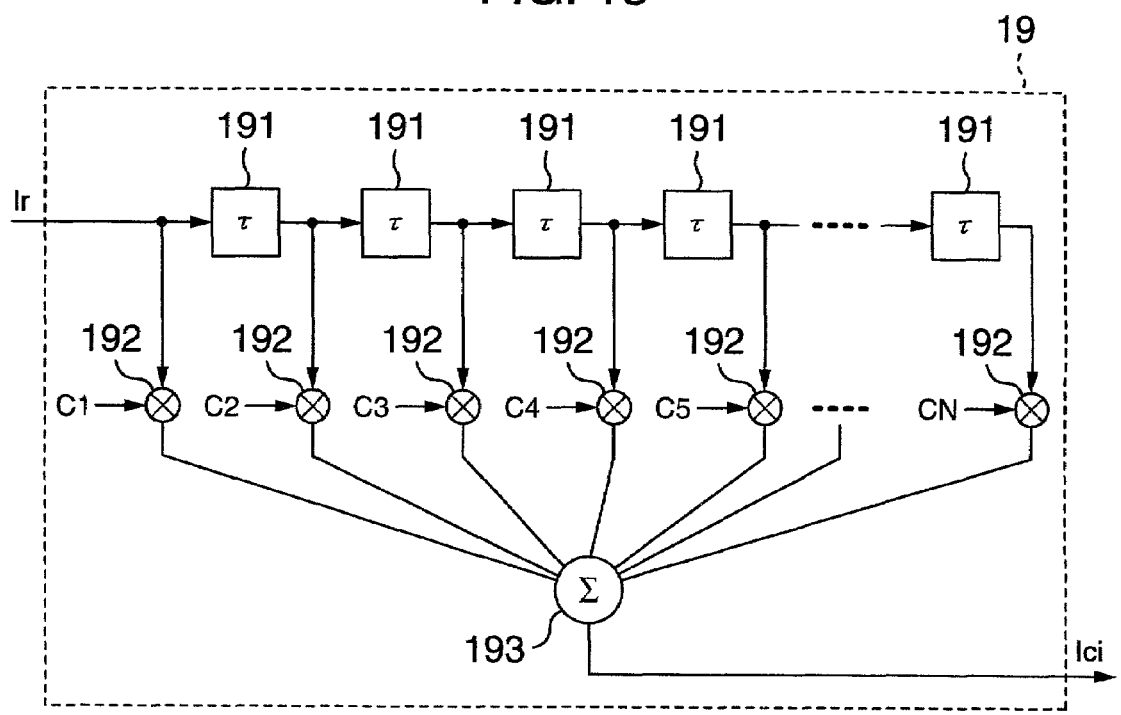
FIG. 13 is a block diagram showing an example of a transversal filter, which is a constituent element of the automatic equalizer shown in FIG. 12.

Transmission data from the transmission side is modulated as a signal having a frame structure comprised of a training signal (DT0, DT1, . . . ) and a data signal (DA0, DA1, . . . ), and converted to an RF signal in the above-mentioned configuration of FIG. 6 at timing show in FIG. 5. As for the RF signal, the antenna switchover switch is switched over in synchronism with a frame pulse Fp shown in (f) of FIG. 5. Thus the RF signal is sent out as a radio wave via either the amplifier 103 and the transmission antenna A 106, or the amplifier 105 and the transmission antenna B 107.

Figure 1:
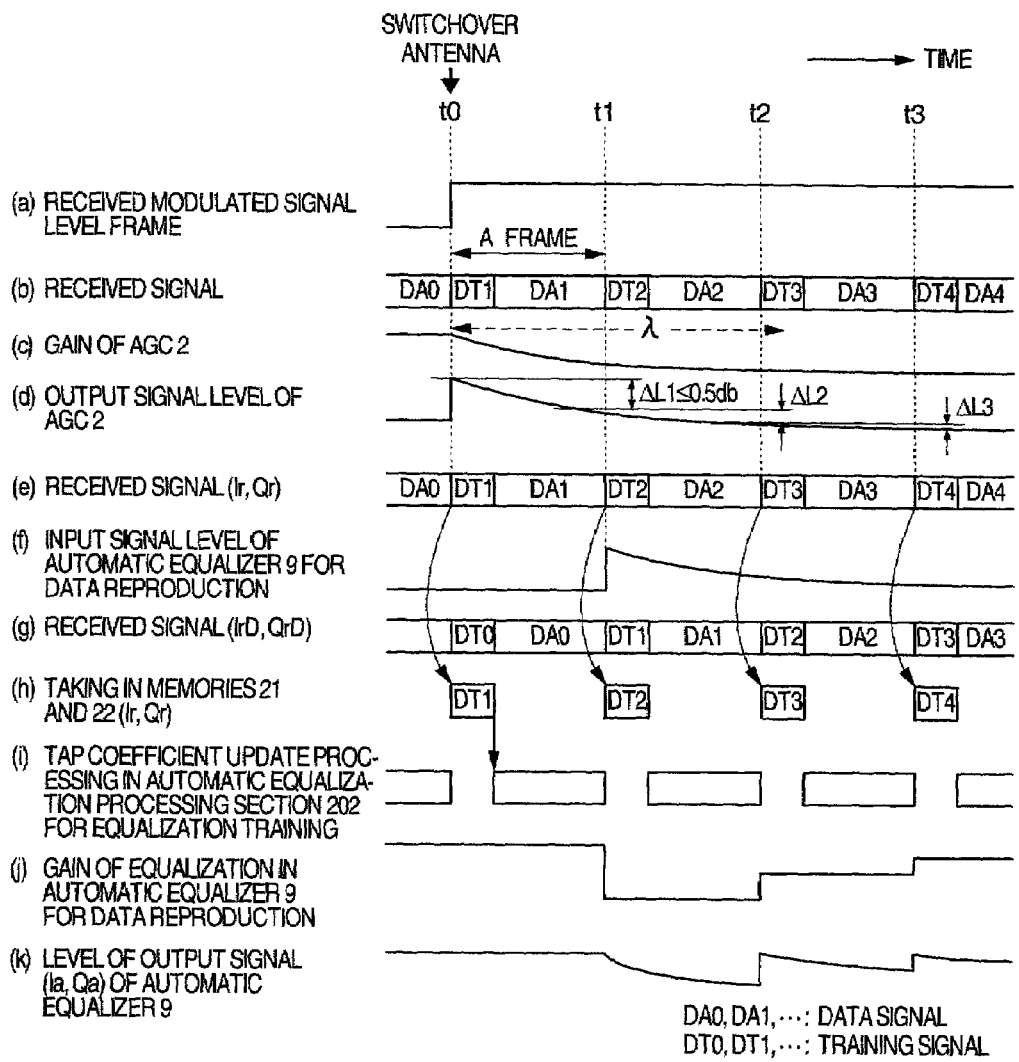
FIG. 1 is a timing chart showing operation of a demodulation section of a first embodiment according to the present invention.

Such an example that the received signal level of the reception side is changed suddenly to become large by the switching between the transmission antennas A and B of the transmission side is shown in FIG. 1. The transmission antenna switchover is conducted in the antenna switchover switch 104 in synchronism with the head of a transmission frame. On the reception side, therefore, the received signal level suddenly changes in a step form at time t0 as shown in (a) of FIG. 1. As shown in the timing chart of FIG. 5 described above, the large sudden change of the received level at the time t0 is caused by switching of the antenna switchover switch 104, which is in turn caused by a switchover command signal Ac generated when the absolute value of the angle $\theta$ formed by the flight direction D of the helicopter 109 and the reception antenna C 108 has become equal to or more than the predetermined value $\phi$ after its change in sign.

In response to this sudden change, the AGC 2 operates so as to make its output signal level constant. As shown in (c) of FIG. 1, therefore, the gain of the AGC 2 decreases from the time t0. As a result, the output signal level of the AGC 2 shown in (d) of FIG. 1 also decreases. Such control of the output signal level is implemented by the AGC function conducted in the AGC processing section 201. That is, the received signal having the output signal level of the AGC 2 shown in (d) of FIG. 1 is converted to a digital signal by the A/D converter 3. The received power is derived by the received poser calculator 4. The gain of the AGC 2 is controlled by the gain setting unit 2A so as to make the input signal level of the received poser calculator 4 constant.

Since the received signal is a modulated wave, its instantaneous amplitude varies at every moment. Especially in the modulated signal of the multi-level amplitude modulation scheme, the amplitude considerably changes. By lengthening the gain control time constant of the AGC 2 to some degree, therefore, its influence is prevented. In addition, the time constant is set to an appropriate value in consideration of the level variation on the transmission path. Typically, the gain is altered on the basis of an exponential function so as to make the output signal of the AGC 2 a constant level As shown in (d) of FIG. 1, therefore, the output signal level of the AGC 2 changes exponentially with time elapse from the time 0 of the sudden change, and gradually approaches the level assumed before the sudden change.

The received signal output from the AGC 2, which changes in received signal level as shown in (d) of FIG. 1, is subjected to demodulation processing and waveform shaping, and generated as a received signal (Ir, Qr) shown in (e) of FIG. 1. And the received signal (Ir, Qr) is subjected to the automatic equalization processing in the automatic equalization processing section for equalization training 202 and the automatic equalizer 9 for data reproduction.

Besides the level difference generated at the time of the antenna switchover on the transmission side as shown in (a) of FIG. 1, the signal of the transmission data undergoes various signal distortions during the signal propagation, resulting in causes of errors of reproduced data. In order to remove the causes, and thereby suppress data errors and obtain reliable reproduced data, automatic equalization processing for equalizing the received signal to the characteristics of the transmission path is carried out.

The automatic equalization processing is conducted in an automatic equalizer for data reproduction 9 and an automatic equalization processing section 202 for equalization training located in stages subsequent to the AGC processing section 201. Their operation has been described earlier and hence description thereof will be omitted.

A received signal (Ir, Qr) of a frame comprised of a training signal (DT0, DT1, . . . ) and a data signal (DA0, DA1, . . . ) having the output signal level of the AGC 2 shown in (d) of FIG. 1 is input to the automatic equalizer 23 for equalization training and the automatic equalizer 9 for data reproduction. However, a received signal (IrD, QrD) of a frame comprised of a training signal (DT0, DT1, . . . ) and a data signal (DA0, DA1, . . . ) delayed by one flame length in delay circuits 27A and 27B shown in (g) of FIG. 1 is supplied to the automatic equalizer 9 for data reproduction. On the other hand, the training signal (DT0, DT1, . . . ) is temporarily taken into memories 21 and 22 via switch circuits 20A and 20B as shown in (h) of FIG. 1, read out at predetermined timing, and supplied to the automatic equalizer 23 for equalization training.

The automatic equalization processing section 202 for equalization training operates so as to conduct equalization with respect to the characteristics of the transmission path. As a matter of course, therefore, the level of the training signal is also equalized and corrected. That is, if a training signal having a high level is input at time t0 and thereafter, the automatic equalization processing section 202 for equalization training lowers the gain of equalization in the tap coefficient update processing shown in (i) of FIG. 1 so as to cause an output signal (Ia', Qa') of the automatic equalizer 23 for equalization training have a desired signal level. For the data signal other than the training signal, the tap coefficient update processing is not conducted. On the basis of tap coefficients set by the training signal of the received signal, the data signal is subjected to automatic equalization processing in the automatic equalizer 9 for data reproduction. Thus a signal (Ia, Qa) is output.

However, the AGC processing section 201 operates independently of the automatic equalization processing section 202 for equalization training and the automatic equalizer 9 for data reproduction. With respect to the data signal DA0, DA1, . . . , therefore, gains of equalization in the automatic equalization processing section 202 for equalization training and the automatic equalizer 9 for data reproduction are not altered, but the AGC processing section 201 conducts AGC operation and attempts to alter its output signal level.

On the other hand, on the basis of the training signal DT1 immediately after the sudden level change caused at time t0 in FIG. 1, the tap coefficients of the automatic equalization processing section 202 for equalization training and the automatic equalizer 9 for data reproduction are updated and the gain of equalization is determined. However, the AGC processing section 201 continues to operate. Depending upon the elapse time between the head of a frame at time t0 and the tail of the frame at t1, therefore, the AGC processing section 201 lowers the gain and accordingly its output signal level drops by a signal level difference $\Delta L1$ as shown in (d)

of FIG. 1. As a result, a signal level difference similar to the signal level difference ΔL1 occurs in the output signal levels of the automatic equalizers 9 and 23 as well as shown in (k) of FIG. 1. If the signal level difference ΔL1 of this drop causes the received signal to exceed an identification boundary of the identifying unit 10, then the reproduced data becomes erroneous.

If the signal level difference ΔL1, ΔL2, . . . is zero, therefore, then data errors are not generated. However, making the signal level difference equal to zero corresponds to making the time constant of the AGC 2 equal to infinity. In other words, it is equivalent to keep the AGC 2 inactivated. By doing so, the original AGC function is not fulfilled. Therefore, the signal level difference ΔL1, ΔL2, . . . is made as small as possible. If the time constant $\lambda$ of the AGC 2 is lengthened so as to make the signal level difference ΔL1, ΔL2, . . . equal to a nearly negligible small value, for example, so as to satisfy the relation that the signal level difference ΔL1, ΔL2, . . . ≦0.5 dB, then it becomes possible to suppress the occurrence of data errors to the utmost. As the signal level difference ΔL1, ΔL2, . . . decreases, the margin of decision in the decision unit 10 can be increased. Even if the received signal level suddenly changes, therefore, the received signal does not exceed the decision boundary and suitable decision processing is conducted by the decision unit 10. Thus, reproduced data with data errors suppressed is output from a received data terminal 112 via a P/S converter 11.

The gain of the AGC 2 changes with time according to an exponential function. Therefore, the time constant $\lambda$ of the AGC 2 can be calculated back by letting the gain change over one frame time length be equal to 0.5 dB or less.

The gain of equalization in the tap coefficients updated and set in the automatic equalization processing section 202 for equalization training and the automatic equalizer 9 for data reproduction by using second and subsequent training signals DT2, DT3, . . . beginning with time t1 shown in FIG. 1 is reduced as compared with the first training signal as shown in (j) of FIG. 1. Because the AGC processing section 201 has operated by one frame and conducts gain correction. In the same way as the first frame, a signal level difference ΔL2 corresponding to a drop caused by time elapse on the basis of the exponential function of the AGC gain occurs at the time of an end point of a second frame (DT2, DA2) of the received signal. However, the signal level difference ΔL2 is smaller than the signal level difference ΔL1 at the time point of the end of the first frame (DT1, DA1) of the received signal. Thereafter, in the same way, a signal level difference ΔLN for the Nth frame (DTN, DAN) of the received signal is smaller than that for the (N−1)th frame.

The time constant of the AGC 2 may be derived from the first signal level difference ΔL1 and set before system operation.

In the present invention, the time constant of the AGC processing is made longer than the original design value determined so as to be able to follow the variation of the characteristics of the transmission path. This is a time constant determined without considering a combination with the automatic equalization processing. If the time constant of the AGC processing is determined by considering the relation to the automatic equalization processing as in the present invention, then the situation differs from that of the case where the time constant of the AGC is simply lengthened. From the viewpoint of the output of the automatic equalization processing, the time constant is a total time constant of the AGC processing and the automatic equalization processing. As a whole, the time constant is not lengthened.

A second embodiment of a signal demodulation apparatus according to the present invention will now be described. In this embodiment, the gain setting of the AGC 2 is conducted in accordance with the received power calculated every frame of the received signal, in synchronism with each frame of the received signal. During the frame period of the received signal, the gain is made constant.

Figure 3:
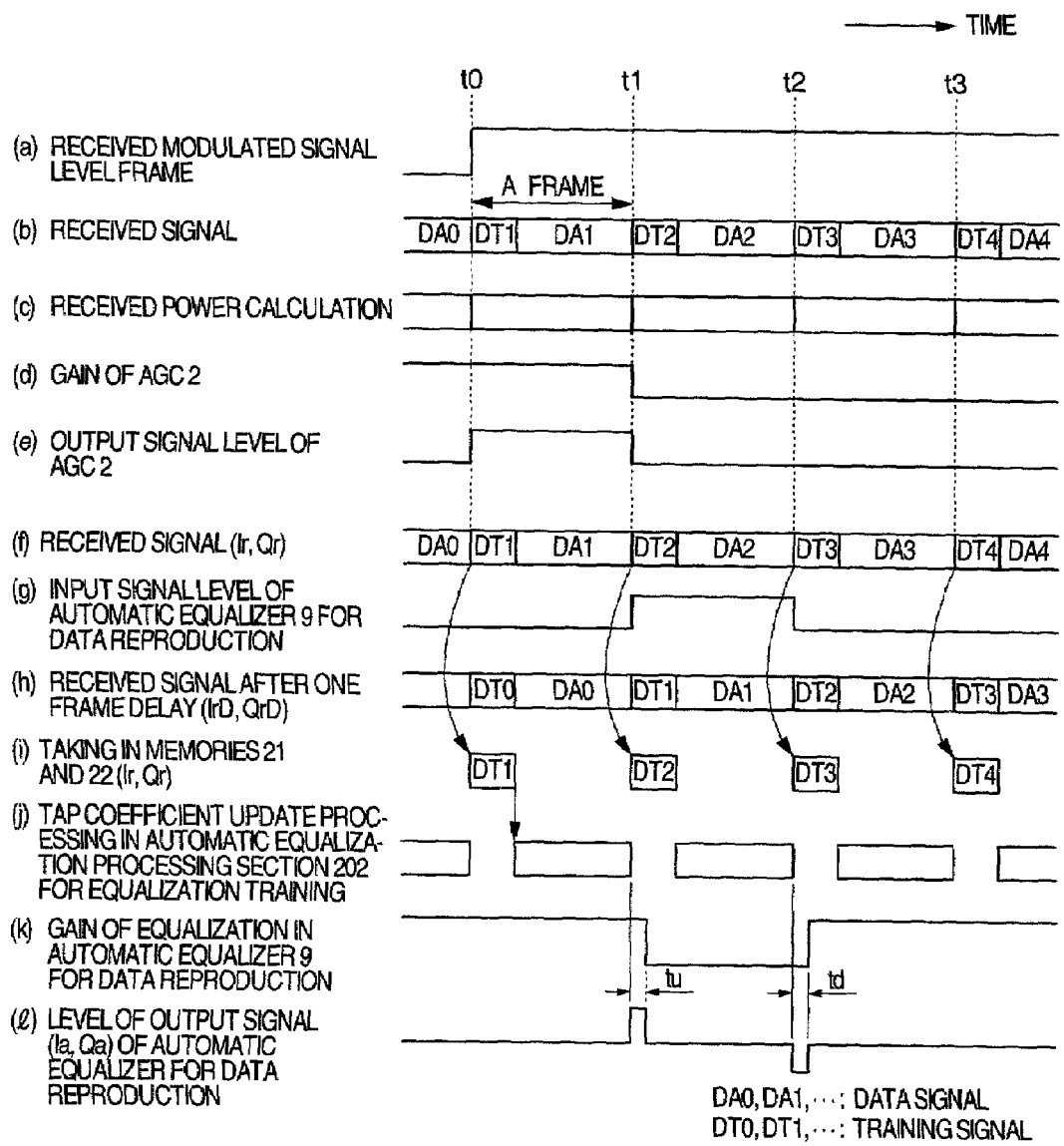
FIG. 3 is a signal timing chart showing operation of a demodulation section of a second embodiment according to the present invention.
Figure 4:
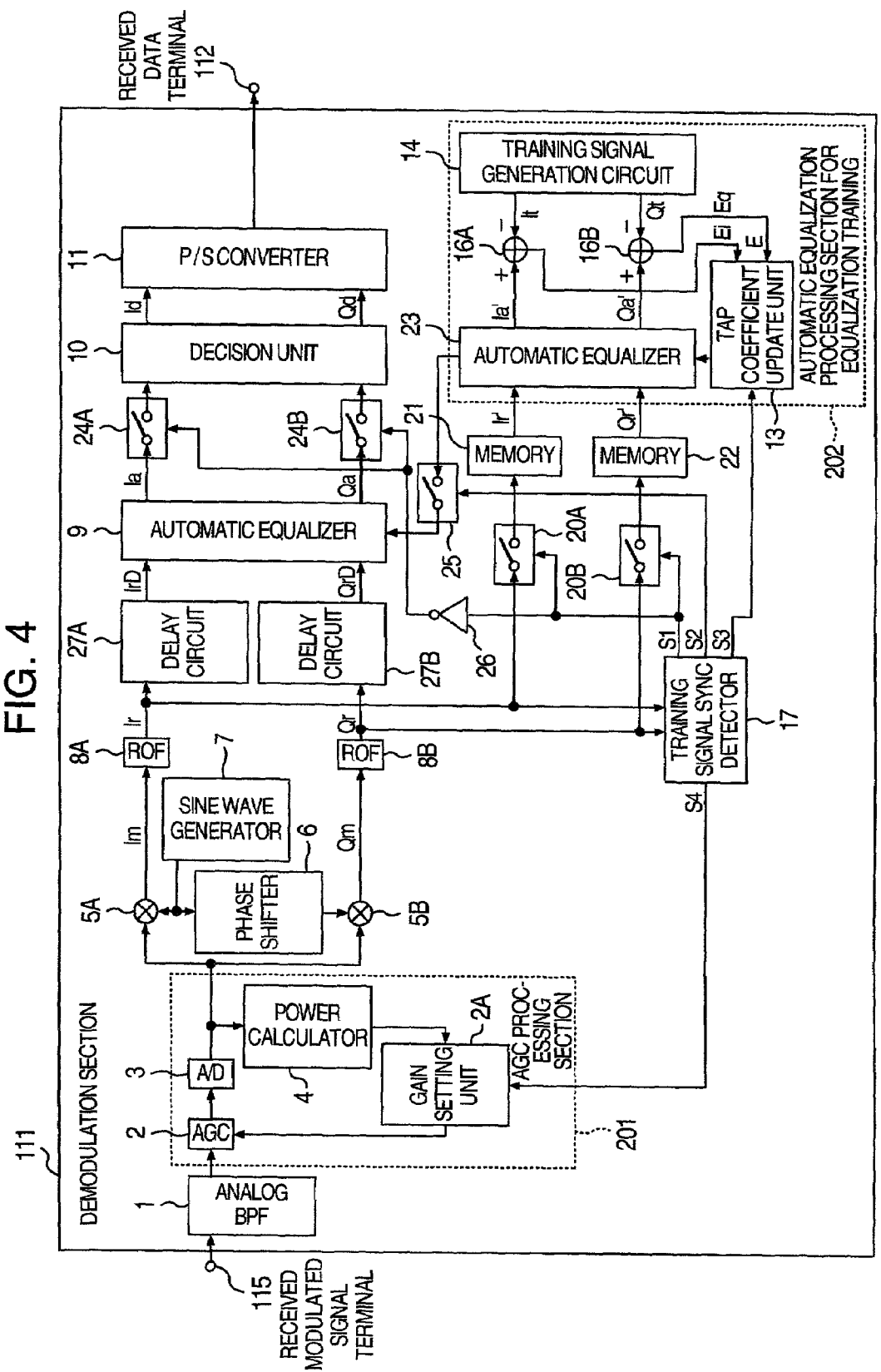
FIG. 4 is a block diagram showing a demodulation section of the second embodiment according to the present invention.

In the same way as the above-mentioned first embodiment of the present invention, such an example that the received signal level of the reception side is suddenly changed to become large by the antenna switchover of the transmission side will now be described by referring to FIGS. 3 and 4. FIG. 4 shows a configuration example of the demodulation section 111 that implements the second embodiment of the present invention. FIG. 3 is its signal timing chart. As shown in (a) of FIG. 3, the received signal level becomes high in a step form at time t0.

Figure 2:
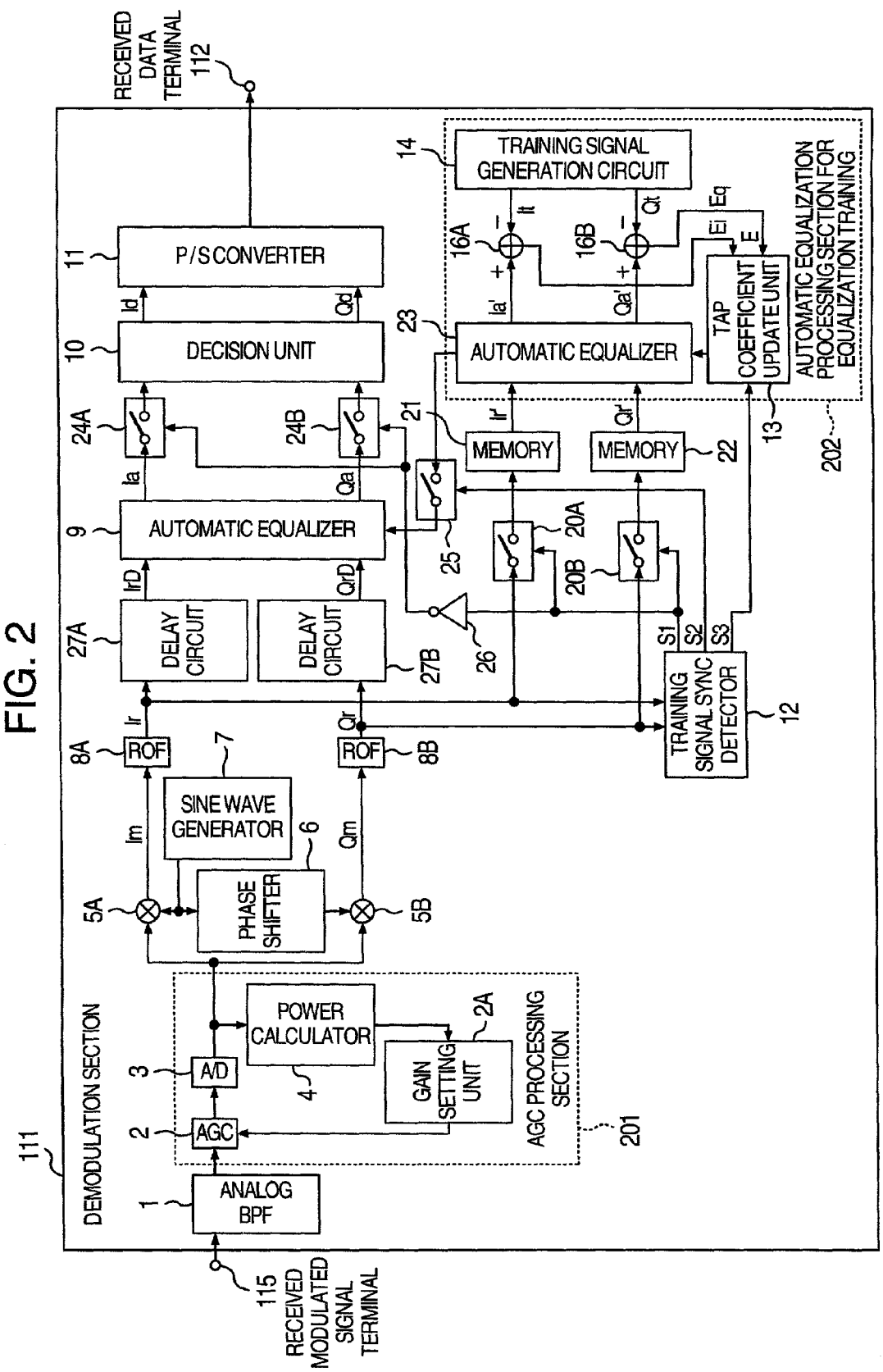
FIG. 2 is a block diagram showing a demodulation section of the first embodiment of the present invention.

In the configuration of the demodulation section 111 of FIG. 4, a component denoted by the same character as that of FIG. 2, which shows the configuration of the demodulation section 111 of the first embodiment according to the present invention, has like function, and consequently description thereof will be omitted. However, numeral 17 in FIG. 4 denotes a training signal synchronization detector. In addition to the function of the training signal synchronization detector 12 shown in FIG. 2, the training signal synchronization detector 17 supplies a timing signal S4 to a gain setting unit 2A as a timing signal for setting the gain in the AGC 2, in synchronism to the head of a frame of the received signal.

As for operation of an AGC processing section 201, it calculates the received power corresponding to one frame of the received signal, and conducts gain setting according to the received power only at the head of the training signal of the subsequent frame. That is, on the basis of a value of received power corresponding to one frame calculated by a received power calculator 4, the gain of the AGC 2 is controlled via a gain setting section 2A. However, the gain of the AGC 2 is set at the head of the training signal of each frame of the received signal by a timing signal S4 synchronized to each frame of the received signal and supplied from the training signal synchronization detector 17. In each data signal portion of the received frame, the gain is not altered.

In the case where the received signal level has become high stepwise as shown in (a) of FIG. 3, it means that the transmission side has conducted the transmission antenna switchover in synchronism with the head of the frame. On the reception side as well, the level changes at the head of the frame. The AGC processing section 201 performs the operation as described above. Between the time t0 and t1 of the frame (containing the signals DT1 and DA1) that has changed in received signal level, therefore, the gain of the AGC 2 is not yet altered. The received signal level of the one frame is calculated, and the gain of the AGC 2 is altered at time t1, which is the head of a training signal DT2 of the next frame, as shown in (d) of FIG. 3.

In this case, instantaneous received power is not calculated every minute, but the received power over one frame length is calculated. Therefore, the gain of the AGC 2 conformed to the received signal level is set. As shown in (e) of FIG. 3, therefore, the output signal level of the AGC 2 rises above for one frame ranging from the time t0 to t1. In time periods of frames after the time t1, the gain conformed to the received signal level is set, and the output signal level of the AGC 2 becomes constant.

The received signal changed in received signal level and output from the AGC 2 as shown in (e) of FIG. 3 is subjected to demodulation processing and waveform shaping, and generated as a received signal (Ir, Qr) shown in (f) of FIG. 3. The received signal (Ir, Qr) is subjected to automatic equalization processing in an automatic equalization processing section 202 for equalization training and an automatic equalizer 9 for data reproduction.

In the automatic equalization processing section 202 for equalization training, the training signal DT1 immediately after the variation of the received signal level is temporarily taken in memories 21 and 22 and read at predetermined timing, and tap coefficient update processing is conducted. As shown in (g) of FIG. 3, therefore, the training signal DT1 is input leaving its level high. As shown in (k) of FIG. 3, therefore, the gain of equalization of the automatic equalizer 9 is lowered by tap coefficient update and setting of the automatic equalization processing section 202 for equalization training. And as shown in (l) of FIG. 3, the level of an output signal (Ia, Qa) of the automatic equalizer 9 for data reproduction remains constant.

With respect to a second frame (containing signals DT2 and DA2) shown in (b) of FIG. 3, a received power calculator 4 calculates received power of a first frame (containing signals DT1 and DA1) of the received signal, judges the received signal level to be high, and conducts gain setting for lowering the gain of the AGC 2 in a gain setting unit 2A. And as shown in (d) of FIG. 3, the gain is set in the AGC 2 by a timing signal S4 synchronized to a frame, at time t1 located at the head of the second frame of the received signal. Thus the gain is lowered, and AGC processing is conducted on the second frame of the received signal. If AGC processing is conducted on the second frame of the received signal as shown in (b) of FIG. 3, the output signal level of the AGC 2 returns to a predetermined level as shown in (e) of FIG. 3. Subsequently, after demodulation processing and waveform shaping, a received signal (Ir, Qr) shown in (f) of FIG. 3 is generated. And the received signal is delayed in delay circuits 27A and 27B by one frame, and supplied to the automatic equalizer 9 for data reproduction as a frame containing the training signal DT2 and the data signal DA2 as shown in (h) of FIG. 3 and having a signal level made equal to a predetermined level as shown in (g) of FIG. 3.

On the other hand, the training signal DT2 shown in (f) of FIG. 3 is supplied to the automatic equalization processing section 202 for equalization training via memories 21 and 22. The training signal DT2 has been subjected to AGC processing with a suitable gain, and corrected to become a predetermined level. By update setting of the tap coefficient update processing conducted by the automatic equalization processing section 202 for equalization training on the basis of the signal DT2, therefore, the gain of equalization of the automatic equalizer 9 for data reproduction once lowered returns to a predetermined gain as shown in (k) of FIG. 3. The predetermined level before the transmission antenna switchover is thus restored.

The level of the output signal (Ia, Qa) shown in (l) of FIG. 3 rises above and falls down in time periods tu and td, respectively. This is due to occurrence of a delay caused by automatic equalization processing conducted while the received signal is being shifted among delay elements in the automatic equalizer 9 for data reproduction, although the update and setting of the tap coefficients for the automatic equalizer 9 for data reproduction have been conducted by using the training signal DT1 or DT2. As shown in (g) and (h) of FIG. 3, the levels of the level up of the training signal DT1 and the level down of the training signal DT2 is not equalized sufficiently. Therefore, such a signal level remains for a time corresponding to the product of the number of delay elements and the time shift repetition period. Since this does not occur in the data signal (DA0, DA1, DA2, . . . ), however, it does not become a factor that causes errors of reproduced data.

Thus, with respect to a change of the received signal level generated by the transmission antenna switchover, the signal level of the first frame of the received signal immediately after the change is corrected with the gain of the equalization on the basis of the training signal DT1 by the automatic equalization processing section 202 for equalization training and the automatic equalizer 9 for data reproduction. As for the signal level of the second and subsequent frames of the received signal, the AGC gain is suitably set on the basis of the received power of the first frame of the received signal calculated by the AGC processing section 201 and AGC processing is conducted. As a result, the gain of equalization of the automatic equalizer 9 for data reproduction returns to a predetermined gain. In the data signal of each frame of the received signal as shown in (l) of FIG. 3, therefore, the level of the output signal (Ia, Qa) of the automatic equalizer 9 for data reproduction becomes constant regardless of the level difference generated by the transmission antenna switchover.

Even if the received signal level suddenly changes, therefore, the identification boundary is not exceeded, and suitable identification processing is conducted by an identifying unit 10. Reproduced data with data errors suppressed is output from a received data terminal 112.

Even if the transmission side conducts a selection among a plurality of transmission antennas in synchronism with a frame and conducts switchover, the reception side suppresses the level variation during the frame period of the received signal by making the time constant in the AGC processing longer than the time constant of the original design value or setting the gain of the AGC in synchronism with the received frame, and subsequently conducts automatic equalization processing, according to the present invention as heretofore described. Therefore, it becomes possible to absorb the level difference of the received signal generated by the transmission antenna switchover, reduce the level variation of the output signal of the automatic equalization processing, ensure the decision margin, and reproduce reliable data with data errors suppressed.

In the embodiments of the present invention, an example of switching between two transmission antennas has been mentioned. Also in a radio data transmission system that conducts continuous data transmission while conducting a selection and switching among three or more transmission antennas, it is possible in the same way to reproduce reliable data with data errors suppressed.

The invention claimed is:

1. A demodulation method for reproducing data from a signal received via a signal transmission path, said demodulation method comprising the steps of:
   receiving a signal including a series of frames each frame containing a training signal for automatic equalization processing and a data signal;
   controlling an amplitude of the received signal by automatic gain control (AGC) processing to be a predetermined level;
   demodulating said received signal processed by said AGC processing;

periodically conducting automatic equalization processing to the demodulated signal so as to adapt said demodulated signal to characteristics of said signal transmission path based on each training signal of said frame; and setting values of a time constant of said AGC processing and an updating repetition period of said automatic equalization processing so as to have a predetermined relation, wherein the time constant of said AGC processing is set so as to become longer than said updating repetition period of said automatic equalization processing.

2. A demodulation method according to claim 1, wherein said time constant is so set that a change of a control gain of said AGC processing becomes 0.5 dB or less in one frame period.

3. A demodulation method for reproducing data from a signal received via a signal transmission path, said demodulation method comprising the steps of:

receiving a signal including a series of frames each frame containing a training signal for automatic equalization processing and a data signal; controlling an amplitude of the received signal by automatic gain control (AGC) processing to be a predetermined level;

demodulating said received signal processed by said AGC processing;

periodically conducting automatic equalization processing to the demodulated signal so as to adapt said demodulated signal to characteristics of said signal transmission path based on each training signal of said frame; and setting values of a time constant of said AGC processing and an updating repetition period of said automatic equalization processing so as to have a predetermined relation, wherein setting a control gain of said AGC processing is conducted in synchronism with setting timing of updating value of tap coefficients of an automatic equalizer for performing and automatic equalization processing.

4. A demodulation method for reproducing data from a signal received via a signal transmission path, said demodulation method comprising the steps of:

receiving a signal including a series of frames each frame containing a training signal for automatic equalization processing and a data signal;

controlling an amplitude of the received signal by automatic gain control (AGC) processing to be a predetermined level;

demodulating said received signal processed by said AGC processing;

periodically conducting automatic equalization processing to the demodulated signal so as to adapt said demodulated signal to characteristics of said signal transmission path based on each training signal of said frame; and setting values of a time constant of said AGC processing and an updating repetition period of said automatic equalization processing so as to have a predetermined relation, wherein setting a control gain of said AGC processing is conducted every frame of the received signal.

5. A demodulation method according to claim 4, wherein setting said control gain of said AGC processing is conducted at head timing of each frame of said received signal.

6. A demodulation method according to claim 4, wherein setting said control gain of said AGC processing is conducted at every frame, and the value of said control gain is made constant until a subsequent frame is received.

7. A demodulation method for reproducing data from a signal received via a signal transmission path, said demodulation method comprising the steps of:

receiving a signal including a series of frames each frame containing a training signal for automatic equalization processing and a data signal;

controlling an amplitude of the received signal by automatic gain control (AGC) processing to be a predetermined level;

demodulating said received signal processed by said AGC processing;

periodically conducting automatic equalization processing to the demodulated signal so as to adapt said demodulated signal to characteristics of said signal transmission path based on each training signal of said frame; and setting values of a time constant of said AGC processing and an updating repetition period of said automatic equalization processing so as to have a predetermined relation, wherein said received signal is a transmission signal from an antenna switched at timing synchronized to said frames, on a transmission side having a plurality of transmission antennas.

8. A demodulation method for reproducing data from a signal received via a signal transmission path, said demodulation method comprising the steps of:

receiving a signal including a series of frames each frame containing a training signal for automatic equalization processing and a data signal;

controlling an amplitude of the received signal by automatic gain control (AGC) processing to be a predetermined level;

demodulating said received signal processed by said AGC processing;

periodically conducting automatic equalization processing to the demodulated signal so as to adapt said demodulated signal to characteristics of said signal transmission path based on each training signal of said frame; and setting values of a time constant of said AGC processing and an updating repetition period of said automatic equalization processing so as to have a predetermined relation, wherein said received signal is a signal modulated by using a multi-level amplitude modulation scheme.

9. A demodulation apparatus for reproducing data from a signal received via a signal transmission path, said demodulation apparatus comprising;

a signal input section for receiving a signal including a series of frames each frame containing a training signal for automatic equalization processing and a data signal;

an AGC circuit for conducting automatic gain control (AGC) processing on an amplitude of the received signal from said signal input section to making the amplitude a predetermined level;

a demodulation circuit for conducting demodulation processing on an output signal of said AGC circuit; and an automatic equalization circuit including a filter said automatic equalization circuit updating tap coefficients of said filter based on each training signal separated from the signal demodulated by said demodulation circuit, and conducting automatic equalization processing so as to adapt said demodulated signal to characteristics of the signal transmission path, wherein values of a time constant of said AGC circuit and an updating repetition period of said automatic equalization circuit are set so as to have a predetermined relation, wherein said AGC circuit comprises:

a variable gain amplifier for receiving and amplifying the received signal, a power calculator for calculating power of received signal from an output of said variable gain amplifier, and a gain setting unit for setting a gain of said variable gain amplifier, and wherein the gain control time constant of said variable gain amplifier being set so as to become longer than said updating repetition period of said tap coefficients.

10. A demodulation apparatus according to claim 9, wherein said AGC circuit is set so as to cause a change of the gain of said variable gain amplifier to become 0.5 dB or less in one frame period.

11. A demodulation apparatus for reproducing data from a signal received via a signal transmission path, said demodulation apparatus comprising:

a signal input section for receiving a signal including a series of frames each frame containing a training signal for automatic equalization processing and a data signal;

an AGC circuit for conducting automatic gain control (AGC) processing on an amplitude of the received signal from said signal input section to making the amplitude a predetermined level;

a demodulation circuit for conducting demodulation processing on an output signal of said AGC circuit; and an automatic equalization circuit including a filter said automatic equalization circuit updating tap coefficients of said filter based on each training signal separated from the signal demodulated by said demodulation circuit, and conducting automatic equalization processing so as to adapt said demodulated signal to characteristics of the signal transmission path, wherein values of a time constant of said AGC circuit and an updating repetition period of said automatic equalization circuit are set so as to have a predetermined relation, and wherein said AGC circuit comprises:

a variable gain amplifier for receiving and amplifying the received signal, a power calculator for calculating power of the received signal from an output of said variable gain amplifier, a gain setting unit for setting a gain of said variable gain amplifier, and means for causing the setting of the gain of said variable gain amplifier conducted by said gain setting unit to be carried out in synchronism with setting timing of updating values of the tap coefficients in said automatic equalization circuit.

12. A demodulation apparatus for reproducing data from a signal received via a signal transmission path, said demodulation apparatus comprising;

a signal input section for receiving a signal including a series of frames each frame containing a training signal for automatic equalization processing and a data signal;

an AGC circuit for conducting automatic gain control (AGC) processing on an amplitude of the received signal from said signal input section to making the amplitude a predetermined level;

a demodulation circuit for conducting demodulation processing on an output signal of said AGC circuit; and an automatic equalization circuit including a filter said automatic equalization circuit updating tap coefficients of said filter based on each training signal separated from the signal demodulated by said demodulation circuit, and conducting automatic equalization processing so as to adapt said demodulated signal to characteristics of the signal transmission path, wherein values of a time constant of said AGC circuit and an updating repetition period of said automatic equalization circuit are set so as to have a predetermined relation, and wherein said AGC circuit comprises:

a variable gain amplifier for receiving and amplifying the received signal, a power calculator for calculating power of the received signal from an output of said variable gain amplifier, a gain setting unit for setting a gain of said variable gain amplifier, and means for causing the setting of the gain of said variable gain amplifier conducted by said gain setting unit to be carried out every frame of said received signal.

13. A demodulation apparatus according to claim 12, wherein said automatic equalization circuit comprises means for generating a signal that corresponds to head timing of each frame of said received signal, and wherein said gain setting unit conducts setting of the gain of said variable gain amplifier at timing of the signal that corresponds to head timing of each frame of said received signal.

14. A demodulation apparatus according to claim 12, wherein said automatic equalization circuit comprises means for generating a signal that corresponds to head timing of each frame of the received signal, and wherein said gain setting unit conducts setting of the gain of said variable gain amplifier every signal that corresponds to head timing of each frame of the received signal, and said gain setting unit does not update a value of said gain until a signal that corresponds to next head timing is input.

15. A demodulation apparatus for reproducing data from a signal received via a signal transmission path, said demodulation apparatus comprising;

a signal input section for receiving a signal including a series of frames each containing a training signal for automatic equalization processing and a data signal;

an AGC circuit for conducting automatic gain control (AGC) processing on an amplitude of the received signal from said signal input section to making the amplitude a predetermined level;

a demodulation circuit for conducting demodulation processing on an output signal of said AGC circuit; and an automatic equalization circuit including a filter said automatic equalization circuit updating tap coefficients of said filter based on each training signal separated from the signal demodulated by said demodulation circuit, and conducting automatic equalization processing so as to adapt said demodulated signal to characteristics of the signal transmission path, wherein values of a time constant of said AGC circuit and an updating repetition period of said automatic equalization circuit are set so as to have a predetermined relation, and wherein said automatic equalization circuit comprises:

means for detecting a training signal from said received signal;

a first automatic equalizer for training signal, a second automatic equalizer for data signal, means for generating such correction coefficients as to make the detected training signal coincide with a predetermined reference training signal, and means for modifying the tap coefficients of said second automatic equalizer with the correction coefficients.

16. A demodulation apparatus for reproducing data from a signal received via a signal transmission path, said demodulation apparatus comprising;

a signal input section for receiving a signal including a series of frames each frame containing a training signal for automatic equalization processing and a data signal;

an AGC circuit for conducting automatic gain control (AGC) processing on an amplitude of the received signal from said signal input section to making the amplitude a predetermined level;

a demodulation circuit for conducting demodulation processing on an output signal of said AGC circuit; and an automatic equalization circuit including a filter said automatic equalization circuit updating tap coefficients of said filter based on each training signal separated from the signal demodulated by said demodulation circuit, and conducting automatic equalization processing so as to adapt said demodulated signal to characteristics of the signal transmission path, wherein values of a time constant of said AGC circuit and an updating repetition period of said automatic equalization circuit are set so as to have a predetermined relation, and wherein said signal input section receives a signal transmitted from an antenna switched over at timing synchronized to the frames on a transmission side having a plurality of transmission antennas.

17. A demodulation apparatus for reproducing data from a signal received via a signal transmission path, said demodulation apparatus comprising;

a signal input section for receiving a signal including a series of frames each containing a training signal for automatic equalization processing and a data signal;

an AGC circuit for conducting automatic gain control (AGC) processing on an amplitude of the received signal from said signal input section to making the amplitude a predetermined level;

a demodulation circuit for conducting demodulation processing on an output signal of said AGC circuit;

an automatic equalization circuit including a filter said automatic equalization circuit updating tap coefficients of said filter based on each training signal separated from the signal demodulated by said demodulation circuit, and conducting automatic equalization processing so as to adapt said demodulated signal to characteristics of the signal transmission path, wherein values of a time constant of said AGC circuit and an updating repetition period of said automatic equalization circuit are set so as to have a predetermined relation, an identifying unit for reproducing data from a data signal output from said automatic equalization circuit.

* * * * *